United States Patent
Jin et al.

(10) Patent No.: US 10,872,869 B2
(45) Date of Patent: Dec. 22, 2020

(54) SEMICONDUCTOR DEVICES AND METHODS OF MANUFACTURING THE SAME

(71) Applicant: Samsung Electronics Co., Ltd., Suwon-si (KR)

(72) Inventors: Jeonggi Jin, Seoul (KR); Ju-Il Choi, Seongnam-si (KR); Teahwa Jeong, Hwaseong-si (KR); Atsushi Fujisaki, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/364,775

(22) Filed: Mar. 26, 2019

(65) Prior Publication Data

US 2020/0058609 A1 Feb. 20, 2020

(30) Foreign Application Priority Data

Aug. 20, 2018 (KR) .......................... 10-2018-0096751

(51) Int. Cl.
*H01L 23/00* (2006.01)
*H01L 21/768* (2006.01)

(52) U.S. Cl.
CPC ........ *H01L 24/03* (2013.01); *H01L 21/76871* (2013.01); *H01L 24/08* (2013.01);
(Continued)

(58) Field of Classification Search
CPC ... H01L 24/03; H01L 24/08; H01L 21/76871; H01L 2224/02331; H01L 2224/0231
See application file for complete search history.

(56) References Cited

U.S. PATENT DOCUMENTS 3,449,144 A * 6/1969 Hatlelid .................. C25D 3/44
427/154
6,433,402 B1 8/2002 Woo et al.
(Continued)

FOREIGN PATENT DOCUMENTS

JP 57139939 A * 8/1982
JP H 6163714 A 6/1994
JP H 4567410 B2 10/2010

OTHER PUBLICATIONS

Sarvestani et al., Frequency-Dependent Control of Grain Size in Electroplating Gold for Nanoscale Applications, 2010, Electrochemical and Solid-State Letters, 13 (6) D37-D39 (2010). (Year: 2010).*

*Primary Examiner* — Syed I Gheyas
(74) *Attorney, Agent, or Firm* — Harness, Dickey & Pierce, P.L.C.

(57) ABSTRACT

Disclosed are semiconductor devices and methods of manufacturing the same. The method includes providing a semiconductor substrate, forming a redistribution line on a top surface of the semiconductor substrate, and forming a passivation layer to cover the redistribution line on the top surface of the semiconductor substrate. The forming a redistribution line includes a first stage of forming a first segment of the redistribution line on the top surface of the semiconductor substrate, and a second stage of forming a second segment of the redistribution line on the first segment of the redistribution line. An average grain size of the second segment of the redistribution line is less than an average grain size of the first segment of the redistribution line.

18 Claims, 8 Drawing Sheets

(52) U.S. Cl.
CPC .............. *H01L 2224/0231* (2013.01); *H01L 2224/02331* (2013.01)

(56) References Cited

U.S. PATENT DOCUMENTS

| | | |
|---|---|---|
| 9,460,972 B2 | 10/2016 | Park et al. |
| 9,553,059 B2 | 1/2017 | Tsai et al. |
| 9,570,410 B1 | 2/2017 | Chang et al. |
| 2006/0005902 A1 | 1/2006 | Barth et al. |
| 2015/0308007 A1* | 10/2015 | Park .................. C25D 3/32 438/614 |

* cited by examiner

SEMICONDUCTOR DEVICES AND METHODS OF MANUFACTURING THE SAME

CROSS-REFERENCE TO RELATED APPLICATION

This U.S. non-provisional application claims priority under 35 U.S.C § 119 to Korean Patent Application No. 10-2018-0096751 filed on Aug. 20, 2018 in the Korean Intellectual Property Office, the entire contents of which are hereby incorporated by reference.

BACKGROUND

The present inventive concepts relate to semiconductor device and/or methods of manufacturing the same, and more particularly, to semiconductor devices including a redistribution layer and/or methods of manufacturing the same.

Semiconductor devices are beneficial in electronic industry because of their small size, multi-functionality, and/or low fabrication cost. Semiconductor devices are being highly integrated with the development of electronic industry. Line widths of patterns of semiconductor devices are being reduced for higher integration thereof. However, new and/or inexpensive exposure techniques are desired to define finer patterns. Thus, it is difficult to highly integrate semiconductor devices. Accordingly, various researches have been conducted for new integration techniques.

With progress in performance and integration in semiconductor devices, technology for fabricating semiconductor devices or packages with higher signal transfer rates and compact sizes has been developed. For example, redistribution lines are utilized to reduce sizes and to increase electrical characteristics of semiconductor devices.

SUMMARY

Some example embodiments of the present inventive concepts provide semiconductor devices with improved structural stability and/or methods of manufacturing the same.

Some example embodiments of the present inventive concepts provide methods of manufacturing semiconductor devices, which have an enhancement in process convenience.

According to an example embodiment of the present inventive concepts, a method of manufacturing a semiconductor device may include providing a semiconductor substrate, forming a redistribution line on a top surface of the semiconductor substrate, and forming a passivation layer to cover the redistribution line on the top surface of the semiconductor substrate. The forming a redistribution line may include a first stage of forming a first segment of the redistribution line on the top surface of the semiconductor substrate, and a second stage to form of forming a second segment of the redistribution line on the first segment of the redistribution line. An average grain size of the second segment of the redistribution line may be less than an average grain size of the first segment of the redistribution line.

According to an example embodiment of the present inventive concepts, a semiconductor device may include a semiconductor substrate, a redistribution line on a top surface of the semiconductor substrate, the redistribution line including a first segment on the top surface of the semiconductor substrate and a second segment on a top surface of the first segment, a passivation layer covering the redistribution line on the top surface of the semiconductor substrate, and a pad on the passivation layer, the pad penetrating the passivation layer and in contact with the redistribution line. An average grain size of the second segment of the redistribution line may be less than an average grain size of the first segment of the redistribution line.

DETAILED DESCRIPTION

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value include a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
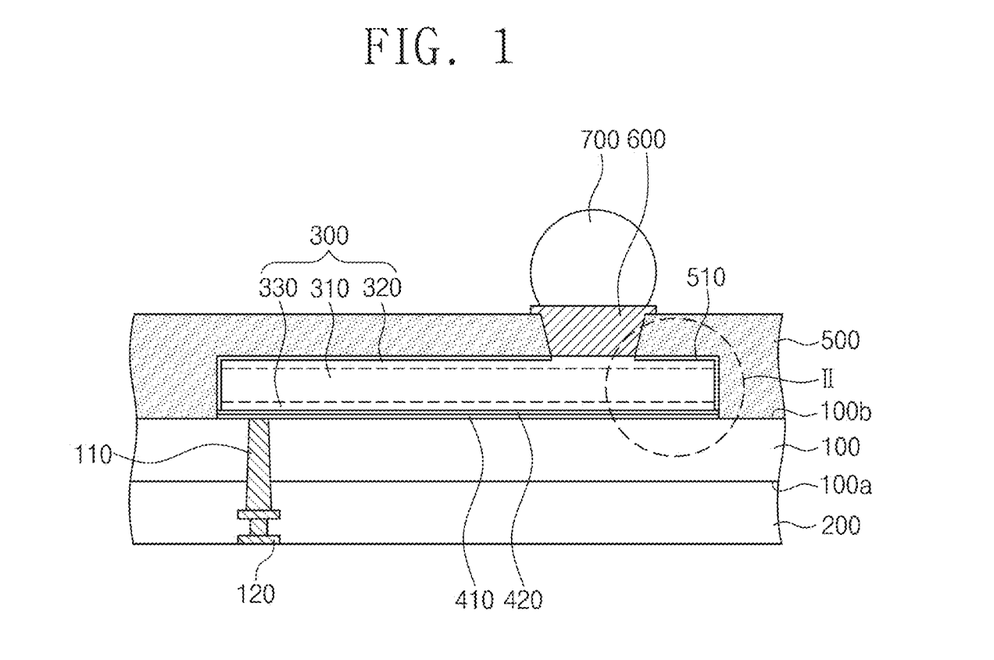
FIG. 1 illustrates a cross-sectional view showing a semiconductor device according to an example embodiment of the present inventive concepts.
Figure 2:
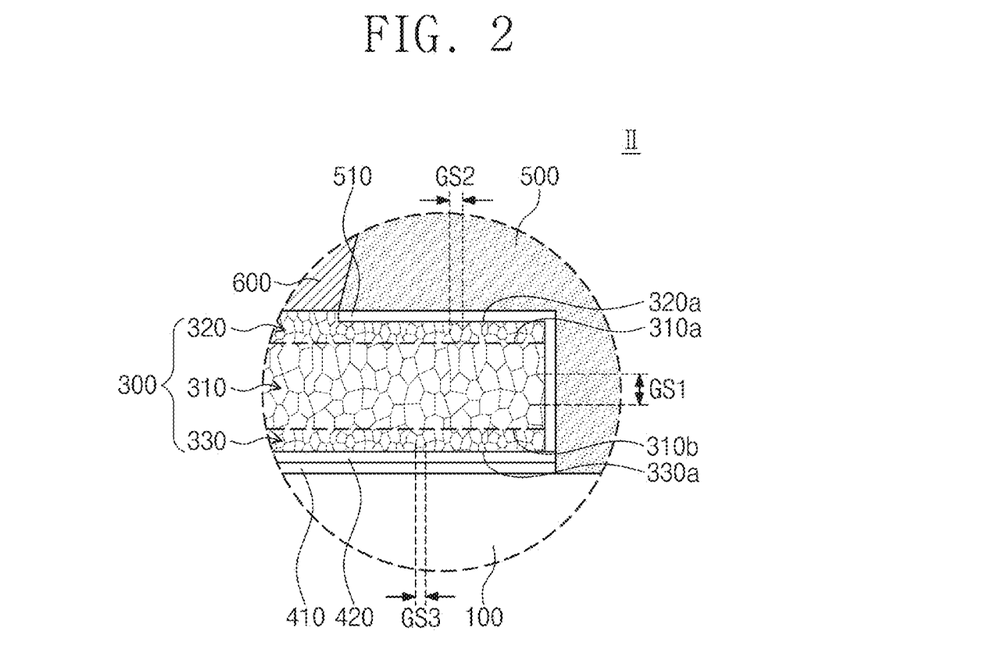
FIG. 2 illustrates an enlarged view showing section II of FIG. 1.

The following will now describe a semiconductor device according to the present inventive concepts with reference to the accompanying drawings. FIG. 1 illustrates a cross-sectional view showing a semiconductor device according to an example embodiment of the present inventive concepts. FIG. 2 illustrates an enlarged view showing section II of FIG. 1.

Referring to FIG. 1, a semiconductor device may include a semiconductor substrate 100 provided with one or more metal lines 120 on a first surface 100a thereof, an interlayer dielectric layer 200 covering the first surface 100a of the semiconductor substrate 100, a through electrode 110 penetrating the semiconductor substrate 100, a redistribution line 300 electrically connected to the through electrode 110, and a passivation layer 500 covering the redistribution line 300. The through electrode 110 may further penetrate at least a portion of the interlayer dielectric layer 200.

The semiconductor substrate 100 may be provided. The semiconductor substrate 100 may have a second surface 100b facing the first surface 100a. The semiconductor substrate 100 may be a semiconductor wafer (e.g., a silicon wafer) including a variety of semiconductor components. For example, the first surface 100a may be an active surface of the semiconductor substrate 100. The first surface 100*a* may be an active surface on which a circuit pattern (not shown) electrically connected to the metal lines 120 is provided, and the second surface 100*b* may be an inactive surface of the semiconductor substrate 100. The circuit pattern (not shown) may include a memory circuit, a logic circuit, or a combination thereof. Although not shown, a passive device (e.g., capacitor or resistor) may be provided on the first surface 100*a* of the semiconductor substrate 100.

The through electrode 110 may penetrate the semiconductor substrate 100, and may be electrically connected to the metal lines 120. The through electrode 110 may include a conductor (e.g., copper (Cu), tungsten (W), or polysilicon). Although not shown, a via dielectric layer and a via barrier layer may further be provided around the through electrode 110. The through electrode 110 may be electrically insulated by the via dielectric layer from the semiconductor substrate 100. The via barrier layer may suppress materials (e.g., copper) of the through electrode 110 from migrating into the semiconductor substrate 100 through a gap between the through electrode 110 and the via dielectric layer. The via barrier layer may include, for example, titanium (Ti), titanium nitride (TiN), titanium tungsten (TiW), tantalum (Ta), tantalum nitride (TaN), or tungsten nitride (WN). The via dielectric layer may include, for example, silicon oxide (SiOx) or silicon nitride (SiNx).

The metal lines 120 may be provided on the first surface 100*a* of the semiconductor substrate 100. The metal lines 120 may be arranged in one or more columns on a center or edge of the first surface 100*a* of the semiconductor substrate 100. The metal lines 120 may be coupled to an internal circuit including the circuit pattern and/or the passive device. The metal lines 120 may electrically connect the circuit pattern and/or the passive device to the through electrode 110.

The interlayer dielectric layer 200 may be provided on the first surface 100*a* of the semiconductor substrate 100. The interlayer dielectric layer 200 may cover the circuit pattern and/or the passive device provided on the first surface 100*a* of the semiconductor substrate 100. The interlayer dielectric layer 200 may protect the circuit pattern and/or the passive device. The interlayer dielectric layer 200 may include oxide or nitride. For example, the interlayer dielectric layer 200 may include silicon oxide (SiOx) or silicon nitride (SiNx).

When the second surface 100*b* is an active surface of the semiconductor substrate 100, a protection layer (also referred to as a passivation layer) or a dielectric layer may be provided on the second surface 100*b* of the semiconductor substrate 100. The protection layer or the dielectric layer may protect a circuit pattern provided on the second surface 100*b* of the semiconductor substrate 100. For example, the protection layer or the dielectric layer may include silicon oxide (SiOx) or silicon nitride (SiNx). The following will describe an example in which the first surface 100*a* is an active surface of the semiconductor substrate 100.

The redistribution line 300 may be provided on the second surface 100*b* of the semiconductor substrate 100. The redistribution line 300 may be electrically connected to the through electrode 110 in the semiconductor substrate 100. The redistribution line 300 may have a thickness of about 15 µm or less, more narrowly from about 10 µm to about 15 µm. The redistribution line 300 may include a metallic material. For example, the redistribution line 300 may be formed of copper (Cu). A barrier layer 410 and a seed layer 420 may be provided between the redistribution line 300 and the semiconductor substrate 100. The barrier layer 410 may include, for example, titanium (Ti), titanium nitride (TiN), titanium tungsten (TiW), tantalum (Ta), tantalum nitride (TaN), or tungsten nitride (WN). The seed layer 420 may include, for example, copper (Cu), ruthenium (Ru), nickel (Ni), or tungsten (W). According to some example embodiments, the barrier layer 410 may not be provided.

Referring to FIG. 2, the redistribution line 300 may include a first segment 310 and a second segment 320 that are sequentially stacked on the second surface 100*b* of the semiconductor substrate 100. The second segment 320 of the redistribution line 300 may have a thickness about 0.01 or 0.5 times that of the first segment 310. The first and second segments 310 and 320 of the redistribution line 300 may be formed of the same material. For example, the first and second segments 310 and 320 of the redistribution line 300 may include copper (Cu). In this case, an interface between the first and second segments 310 and 320 of the redistribution line 300 may not visible, and the first and second segments 310 and 320 may have a continuous configuration at an interface therebetween. In some example embodiments, the interface between the first and second segments 310 and 320 of the redistribution line 300 may be visible.

The second segment 320 may have an average grain size less than that of the first segment 310. In this description, an average grain area may be defined by dividing a certain area by the number of grains included in the certain area, and the diameter of a circle having the average grain area may be defined as the average grain size. In some example embodiments, the average grain size may be determined by a diameter measurement, American Society for Testing and Materials (ASTM) grain size number, or the like. For convenience of description, FIG. 2 exaggerates grain sizes, and a size ratio between grains and materials of the semiconductor device may be different from actual ratios. In the redistribution line 300, the average grain size GS2 of the second segment 320 may be less than about 70% of the average grain size GS1 of the first segment 310. For example, in the redistribution line 300, the average grain size GS2 of the second segment 320 may be about 10% to about 30% of the average grain size GS1 of the first segment 310.

The difference in average grain sizes may cause the second segment 320 of the redistribution line 300 to have a surface roughness less than that of the first segment 310 of the redistribution line 300. For example, a top surface 320*a* of the second segment 320 may have a surface roughness less than that of a top surface 310*a* or a bottom surface 310*b* of the first segment 310. The top surface 320*a* of the second segment 320 may correspond to a top surface of the redistribution line 300, and thus the top surface 320*a* of the second segment 320 and the top surface of the redistribution line 300 may be designated by the same reference numeral 320*a*.

Figure 3:
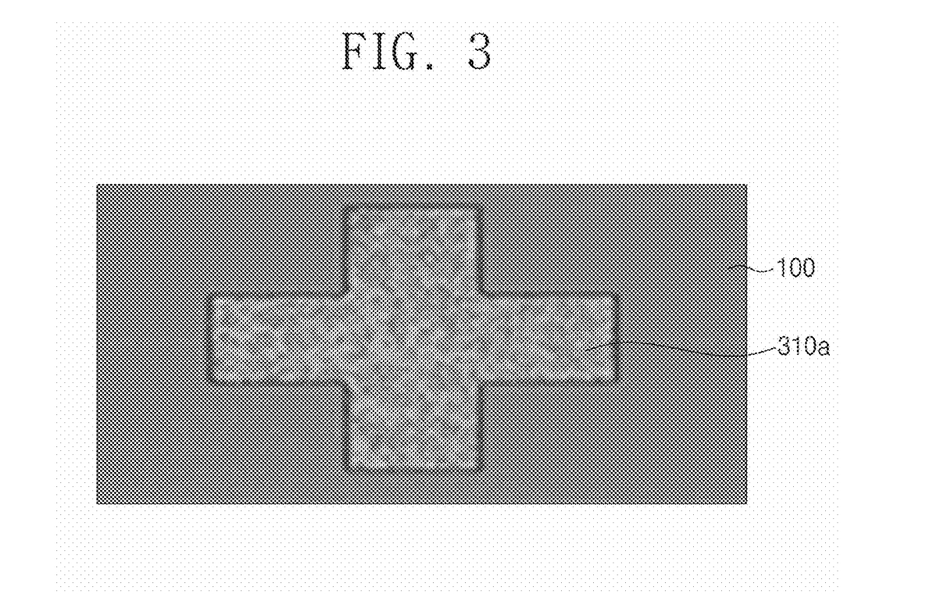
FIG. 3 illustrates a photograph capturing a top surface of a first segment, according to an example embodiment.
Figure 4:
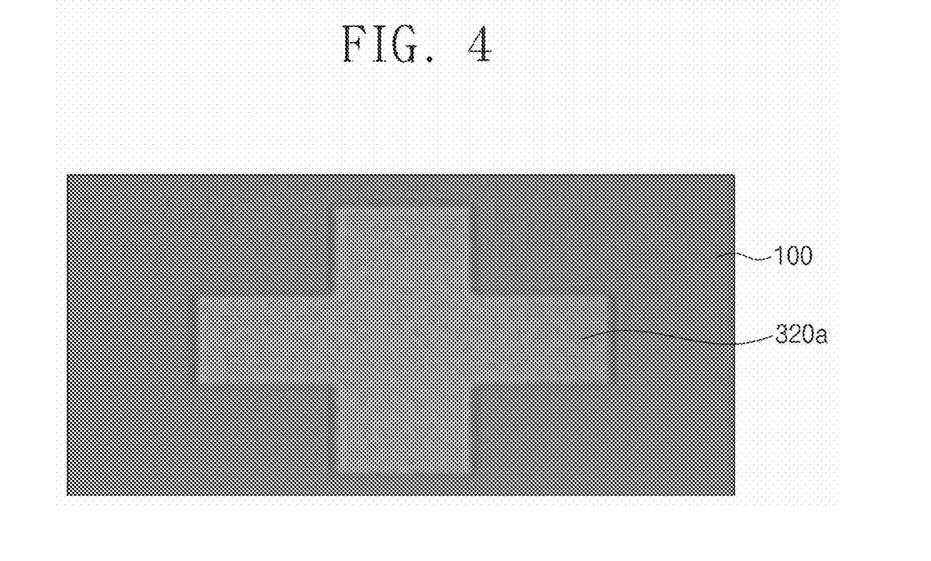
FIG. 4 illustrates a photograph capturing a top surface of a second segment, according to an example embodiment.

FIG. 3 illustrates a photograph of the first segment 310, or a photograph of the top surface 310*a* of the first segment 310. FIG. 4 illustrates a photograph of the second segment 320, or a photograph of the top surface 320*a* of the second segment 320. Referring to FIG. 3, the top surface 310*a* of the first segment 310 of the redistribution line 300 may have high color variation. FIG. 3 may indicate that the top surface 310*a* of the first segment 310 has a relatively high roughness. Referring to FIG. 4, the top surface 320*a* of the second segment 320 of the redistribution line 300 may have low color variation. FIG. 4 may indicate that the top surface 320*a* of the second segment 320 has a relatively low roughness. In other words, the top surface 310*a* of the first segment 310 of the redistribution line 300 has a higher roughness than the top surface 320*a* of the second segment 320. Therefore, the redistribution line 300 may have an increased adhesion force with the passivation layer 500 and/or a redistribution pad 600.

In some example embodiments, metal conductive lines (e.g., pads, other redistribution lines, or metal fillers) may be provided on the redistribution line 300 thereby resulting in an increase in adhesion force between the redistribution line 300 and the metal conductive lines. Because the top surface 320a of the redistribution line 300 has a relatively low surface roughness and a relatively high flatness, voids may be reduced between the redistribution line 300 and the passivation layer 500 or between the redistribution line 300 and the metal conductive lines. As a result, the semiconductor device may improve in structural stability.

In some example embodiments, as shown in FIG. 2, the redistribution line 300 may further include a third segment 330 between the first segment 310 and the semiconductor substrate 100. For example, the redistribution line 300 may include the third segment 330, the first segment 310, and the second segment 320 that are sequentially stacked on the second surface 100b of the semiconductor substrate 100. In the redistribution line 300, the third segment 330 may have an average grain size GS3 less than the average grain size GS1 of the first segment 310. In the redistribution line 300, the average grain size GS3 of the third segment 330 may be less than about 70% of the average grain size GS1 of the first segment 310. For example, a bottom surface 330a of the third segment 330 may have a surface roughness less than that of the bottom surface 310b of the first segment 310. The bottom surface 330a of the third segment 330 may correspond to a bottom surface of the redistribution line 300, and thus bottom surface 330a of the third segment 330 and the bottom surface of the redistribution line 300 may be designated by the same reference numeral 330a. Therefore, the redistribution line 300 may have an increased adhesion force with the semiconductor substrate 100, the barrier layer 410, or the seed layer 420, thereby resulting in an improvement in structural stability of the semiconductor device.

Referring back to FIG. 1, the passivation layer 500 may be provided on the second surface 100b of the semiconductor substrate 100. The passivation layer 500 may cover the redistribution line 300. The passivation layer 500 may include an inorganic dielectric layer or an organic dielectric layer. For example, the passivation layer 500 may include an organic dielectric layer (e.g., photosensitive polyimide (PSPI) or polybenzoxazole (PBO)). The passivation layer 500 may have a thickness of about 3 μm to about 5 μm.

An oxide layer 510 may be provided between the redistribution line 300 and the passivation layer 500. The oxide layer 510 may contact the second segment 320 of the redistribution line 300. The oxide layer 510 may include an oxide material included in the redistribution line 300. The oxide layer 510 may have a thickness of about 50 nm to about 200 nm, more narrowly of about 100 nm. The oxide layer 510 may prevent migration of materials (e.g., copper (Cu)) from the redistribution line 300. In some example embodiments, the oxide layer 510 may not be provided, and the passivation layer 500 may contact the second segment 320 of the redistribution line 300.

A redistribution pad 600 may be provided to have electrical connection with the redistribution line 300. The redistribution pad 600 may contact the redistribution line 300, while penetrating the passivation layer 500 and the oxide layer 510. When viewed in plan, the redistribution pad 600 may be disposed spaced apart from the through electrode 110. The redistribution pad 600 may include a conductive material. The redistribution pad 600 may include metal (e.g., copper (Cu), ruthenium (Ru), nickel (Ni), or tungsten (W)).

An external terminal 700 may be provided on the redistribution pad 600. The external terminal 700 may be shaped like a solder ball. In some example embodiments, the external terminal 700 may be a solder bump.

FIGS. 5 to 14 illustrate cross-sectional views showing a method of manufacturing a semiconductor device according to an example embodiment of the present inventive concepts. FIG. 15 illustrates a graph showing a relationship between current density and grain density obtained from three different experiments performed while forming grains using a step plating process.

Figure 5:
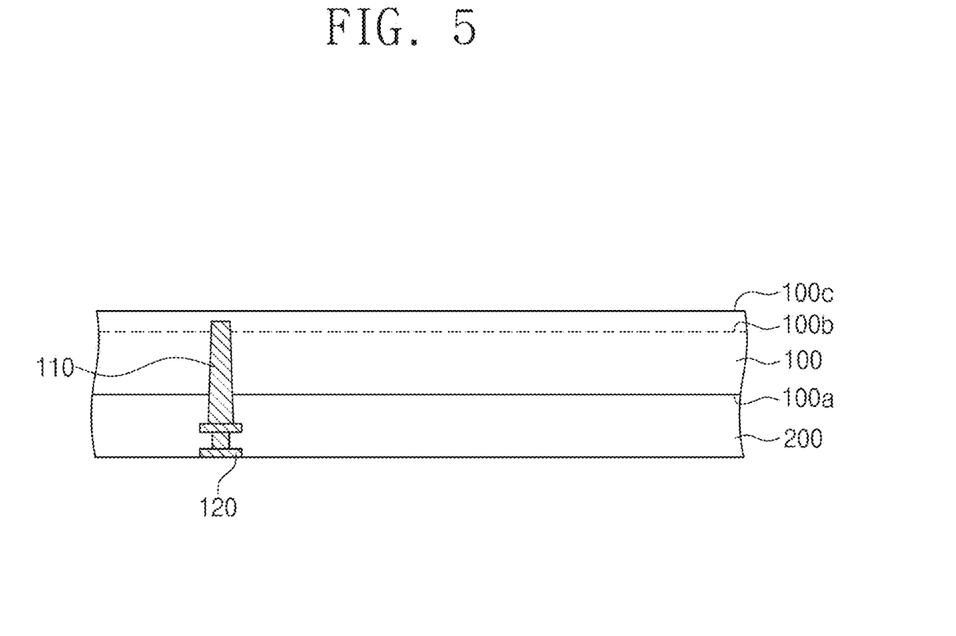
FIGS. 5 to 14 illustrate cross-sectional views showing a method of manufacturing a semiconductor device according to an example embodiment of the present inventive concepts.

Referring to FIG. 5, a semiconductor substrate 100 may be provided to have a first surface 100a and a third surface 100c facing each other. The semiconductor substrate 100 may be a semiconductor wafer including various components of a semiconductor device. The semiconductor substrate 100 may include a circuit pattern (e.g., a memory circuit, a logic circuit, or a combination thereof). For example, a transistor may be formed on the first surface 100a of the semiconductor substrate 100. A passive device (e.g., capacitor or resistor) may also be formed on the first surface 100a of the semiconductor substrate 100.

An interlayer dielectric layer 200, a through electrode 110, and/or metal lines 120 may be formed on the first surface 100a of the semiconductor substrate 100. For example, oxide or nitride covering the circuit pattern and the passive device may be coated on the first surface 100a of the semiconductor substrate 100 to form a portion of the interlayer dielectric layer 200. After that, the through electrode 110 may be formed. For example, a hole may be formed by etching the semiconductor substrate 100 and the portion of the interlayer dielectric layer 200, and then the hole may be filled with a conductive material to form the through electrode 110. The through electrode 110 may have a length that is sufficient to penetrate the semiconductor substrate 100, but is not sufficient to reach the third surface 100c of the semiconductor substrate 100. The through electrode 110 may be formed by plating or depositing a conductor (e.g., copper (Cu), tungsten (W), or polysilicon). Although not shown, a via barrier layer and a via dielectric layer may be formed to surround side and top surfaces of the through electrode 110. Oxide or nitride may be coated to cover the through electrode 110 to form the interlayer dielectric layer 200. The interlayer dielectric layer 200 may be formed to have a single layer consisting of a single material or a multiple layer consisting of a plurality of different materials. The metal lines 120 may be formed on a bottom surface of the interlayer dielectric layer 200. The metal lines 120 may be formed by depositing metal (e.g., copper (Cu), aluminum (Al), or tungsten (W)) on the interlayer dielectric layer 200, and then patterning the metal.

Figure 6:
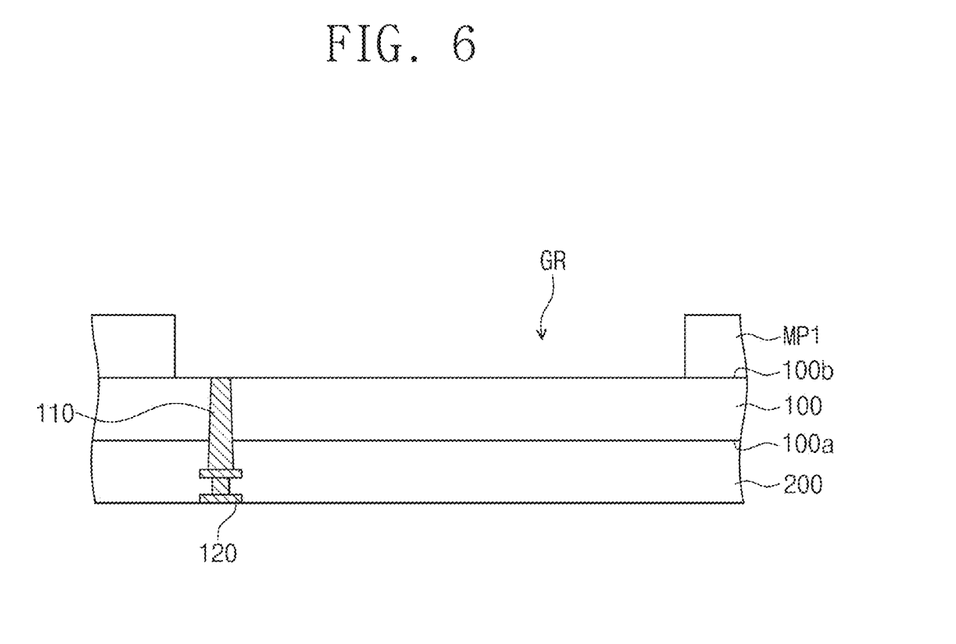

Referring to FIG. 6, the third surface 100c of the semiconductor substrate 100 may be polished. A planarization process (e.g., chemical mechanical polishing (CMP) or etch-back), may be performed on the third surface 100c of the semiconductor substrate 100. The planarization process may reveal a second surface 100b of the semiconductor substrate 100. The semiconductor substrate 100 may become planarized. When the planarization process is performed, the through electrode 110 may also be polished. The second surface 100b of the semiconductor substrate 100 may expose a top surface of the through electrode 110.

A first mask pattern MP1 may be formed on the second surface 100b of the semiconductor substrate 100. The first mask pattern MP1 may have a groove GR that reveals the through electrode 110. The first mask pattern MP1 may include an organic material (e.g., photoresist) or an inorganic material (e.g., silicon oxide (SiOx) or silicon nitride (SiNx)).

Figure 7:
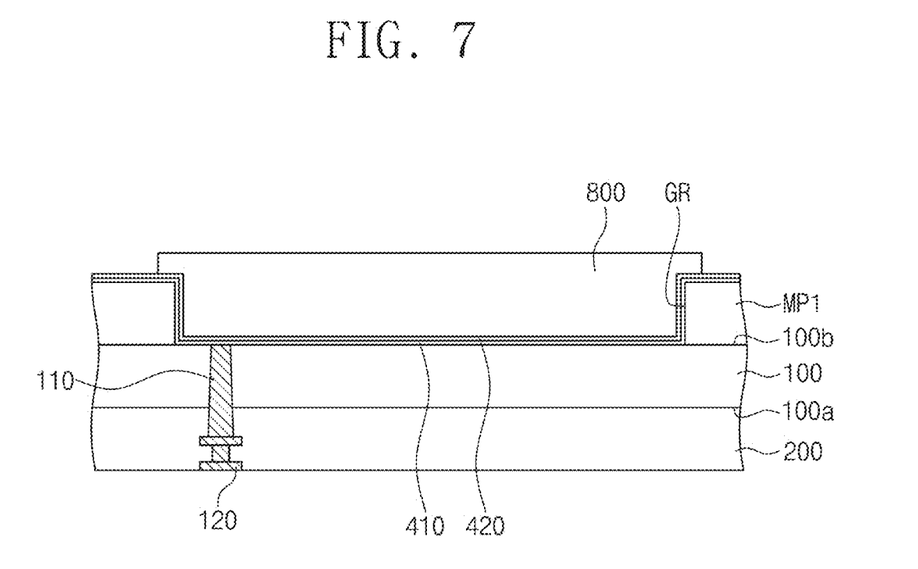

Referring to FIG. 7, a barrier layer 410, a seed layer 420, and a sacrificial layer 800 may be formed on the second surface 100b of the semiconductor substrate 100. The barrier layer 410 may be formed by coating, for example, titanium (Ti), titanium nitride (TiN), titanium tungsten (TiW), tantalum (Ta), tantalum nitride (TaN), or tungsten nitride (WN) to conformally cover the groove GR and a top surface of the first mask pattern MP1. The seed layer 420 may be formed by coating, for example, copper (Cu), ruthenium (Ru), nickel (Ni), or tungsten (W) to cover the barrier layer 410. The sacrificial layer 800 may fill the groove GR. The sacrificial layer 800 may include an organic material (e.g., photoresist) or an inorganic material (e.g., silicon oxide or silicon nitride).

Figure 8:
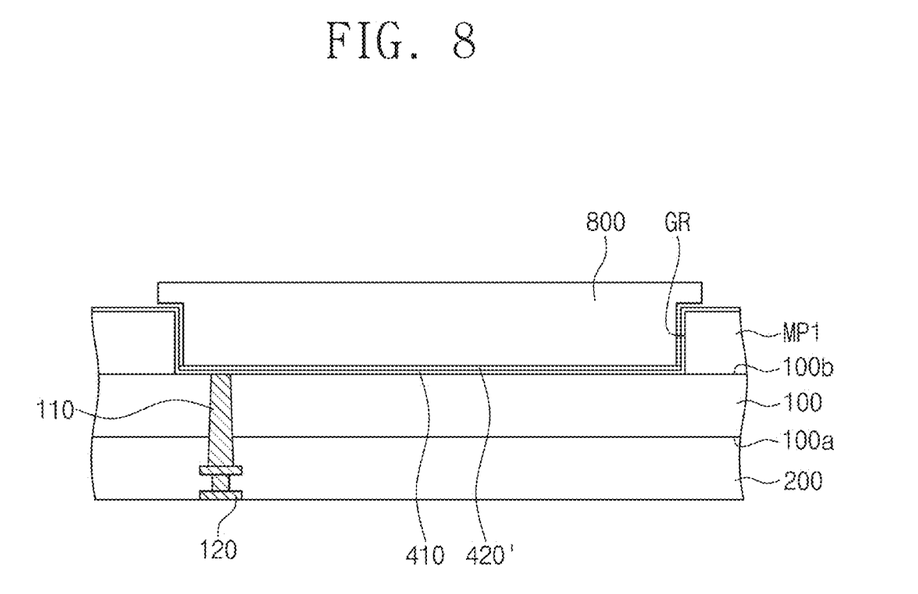

Referring to FIG. 8, the seed layer 420 may be partially removed. A wet etching process may be performed to partially remove the seed layer 420. When the wet etching process is performed, a portion of the seed layer 420 may remain in the groove GR. Thus, the seed layer 420 may be confined in the groove GR and between the sacrificial layer 800 and the barrier layer 410 to form a seed layer pattern 420'. In some example embodiments, the seed layer 420 may be confined in the groove GR, while extending along a side surface of the sacrificial layer 800 from a gap between the sacrificial layer 800 and the barrier layer 410.

Figure 10:
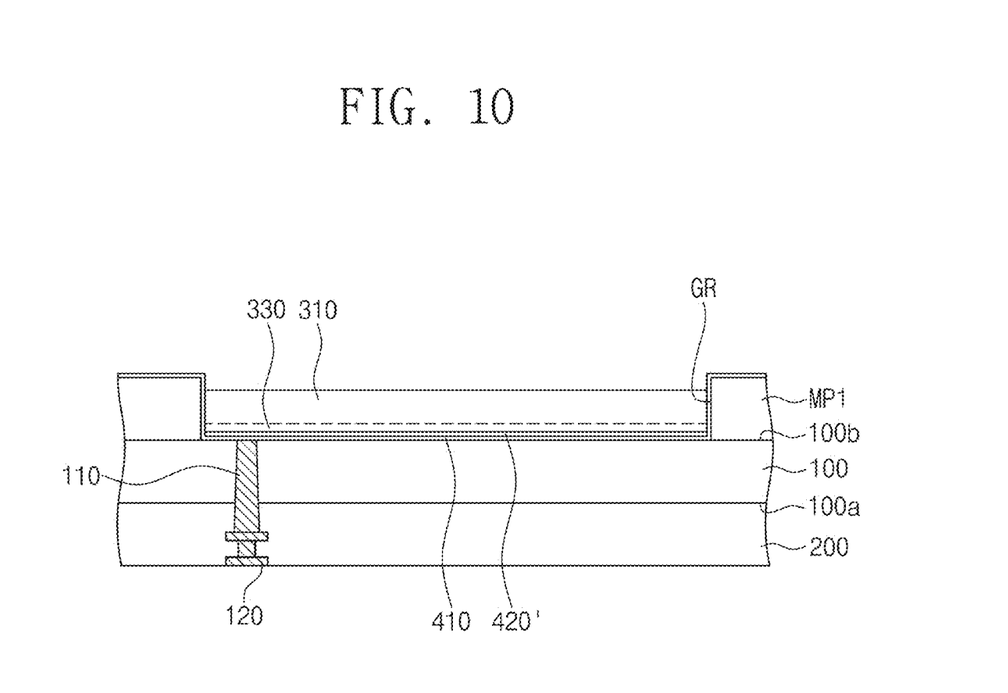
Figure 11:
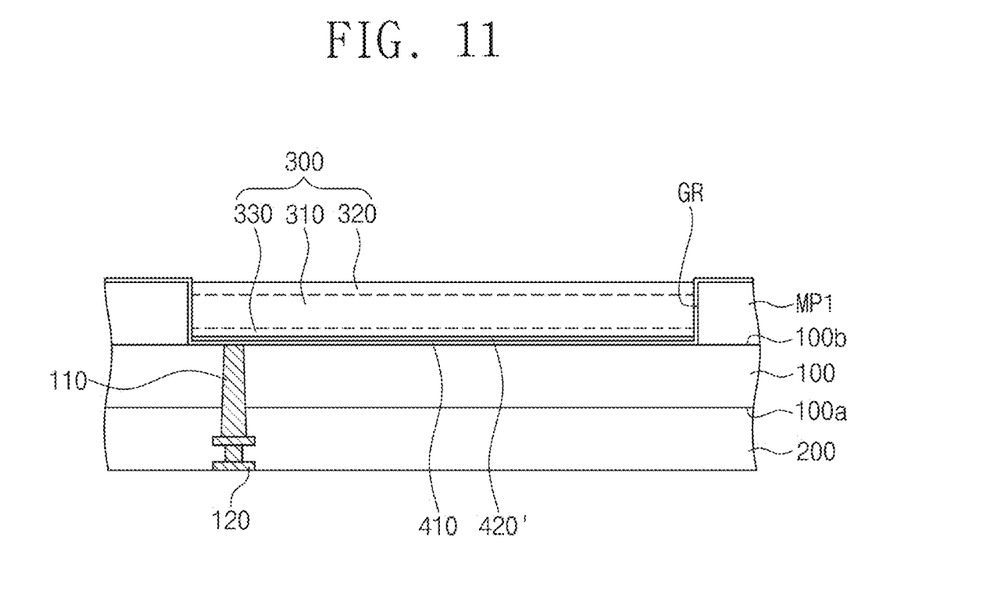

As shown in FIG. 11, after the sacrificial layer 800 is removed, a redistribution line 300 may be formed in the groove GR. The redistribution line 300 may include metal (e.g., copper (Cu)). The following will describe in detail the formation of the redistribution line 300, with reference to FIGS. 9 to 12.

Figure 9:
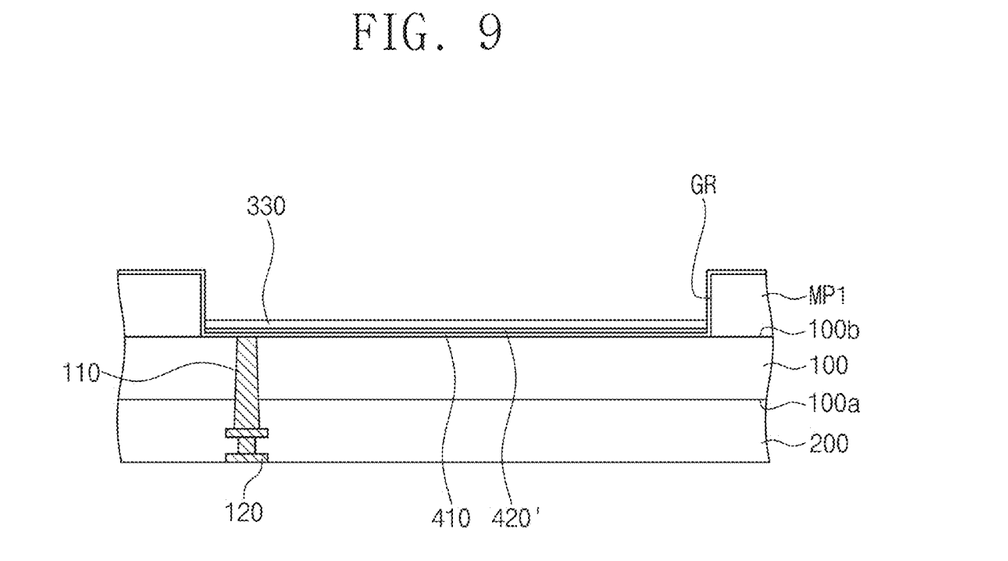

Referring to FIG. 9, the sacrificial layer 800 may be removed, and thus the seed layer pattern 420' may be exposed in the groove GR. A first stage may be performed to form a third segment 330 of the redistribution line 300 in the groove GR. The first stage may include a plating process in which the exposed seed layer pattern 420' serves as a seed. For example, in the plating process, a current density of about 10 mA/cm$^2$ to about 50 mA/cm$^2$ may be applied to the seed layer pattern 420' or a plating solution. The third segment 330 of the redistribution line 300 may be formed to have a thickness of about 0.1 μm to about 2 μm. An interface between the seed layer 420 and the third segment 330 of the redistribution line 300 may not be visible, and thus the seed layer 420 may not be distinguishable from the third segment 330 of the redistribution line 300. For brevity of description, the following will describe an example in which the seed layer 420 is visible.

Referring to FIG. 10, a second stage may be performed to form a first segment 310 of the redistribution line 300 in the groove GR. The second stage may include a plating process in which the third segment 330 of the redistribution line 300 is used as a seed. The first segment 310 of the redistribution line 300 may be formed to have a thickness of about 6 μm to about 15 μm. The plating processes of the first and second stages may be collectively referred to as a step plating process in which the first and second plating processes are successively carried out. For example, the first and second stages may be successively performed at the same bath. The first and second stages may use the same plating solution.

The first segment 310 of the redistribution line 300 may be formed to have an average grain size greater than that of the third segment 330 of the redistribution line 300. A current density applied in the plating process of the first stage may be greater than that applied in the plating process of the second stage. For example, in the second stage, a current density of about 50 mA/cm$^2$ to about 120 mA/cm$^2$ may be applied to the seed layer 420 or the plating solution. As shown in FIG. 15, a grain density may become reduced with an increase in current density applied in the plating process. This tendency may indicate that the higher the current density of the plating process becomes, the smaller the average grain size becomes. When a voltage applied in the second stage is set to be higher than that applied in the first stage, the first segment 310 of the redistribution line 300 may be formed to have greater an average grain size than that of the third segment 330 of the redistribution line 300.

In another example, the plating solution used for the plating process of the second stage may have a greater concentration than the plating solution used for the plating process of the first stage. Therefore, grains of the first segment 310 may grow at a high rate when the second stage is performed. Thus, the first segment 310 of the redistribution line 300 may be formed to have a greater average grain size than the third segment 330 of the redistribution line 300.

Referring to FIG. 11, a third stage may be performed to form a second segment 320 of the redistribution line 300 in the groove GR. The third stage may include a plating process in which the first segment 310 of the redistribution line 300 is used as a seed. The second segment 320 of the redistribution line 300 may be formed to have a top surface at a level the same as or lower than that of the top surface of the first mask pattern MP1. The second segment 320 of the redistribution line 300 may be formed to have a thickness of about 0.1 μm to about 2 μm. The plating processes of the second and third stages may be collectively referred to as a step plating process in which the second and third plating processes are successively carried out. For example, the second and third stages may be successively performed at the same bath. In this case, the second and third stages may use the same plating solution.

The second segment 320 of the redistribution line 300 may be formed to have an average grain size less than that of the first segment 310 of the redistribution line 300. A current density applied in the plating process of the third stage may be less than that applied in the plating process of the second stage. For example, in the third stage, a current density of about 10 mA/cm$^2$ to about 50 mA/cm$^2$ may be applied to the seed layer 420 or the plating solution. When a voltage applied in the third stage is set to be less than that applied in the second stage, the second segment 320 of the redistribution line 300 may be formed to have an average grain size less than that of the first segment 310 of the redistribution line 300.

In another example, the plating solution used for the plating process of the third stage may have a lower concentration than that of the plating solution used for the plating process of the second stage. Therefore, grains of the second segment 320 may grow at a lower rate in the third stage. Thus, the second segment 320 of the redistribution line 300 may be formed to have an average grain size less than that of the first segment 310 of the redistribution line 300.

For another example, a grain refiner may be added to the plating solution used for the plating process of the third stage. Therefore, grains of the second segment 320 may grow at a lower rate in the third stage. Thus, the second segment 320 of the redistribution line 300 may have an average grain size less than that of the first segment 310 of the redistribution line 300.

According to some example embodiments of the present inventive concepts, the redistribution line 300 may be formed to have a relatively small average grain size on its surface portion (e.g., the third segment 330 corresponding to a lower portion of the redistribution line 300 and/or the second segment 320 corresponding to an upper portion of the redistribution line 300) than the first segment 310 of the redistribution line 300. For this purpose, a relatively high current density may be applied in the plating process of the second stage for forming the first segment 310. Thus, the first segment 310 may be formed at a higher rate, and the redistribution line 300 may be formed in a reduced time.

Figure 12:
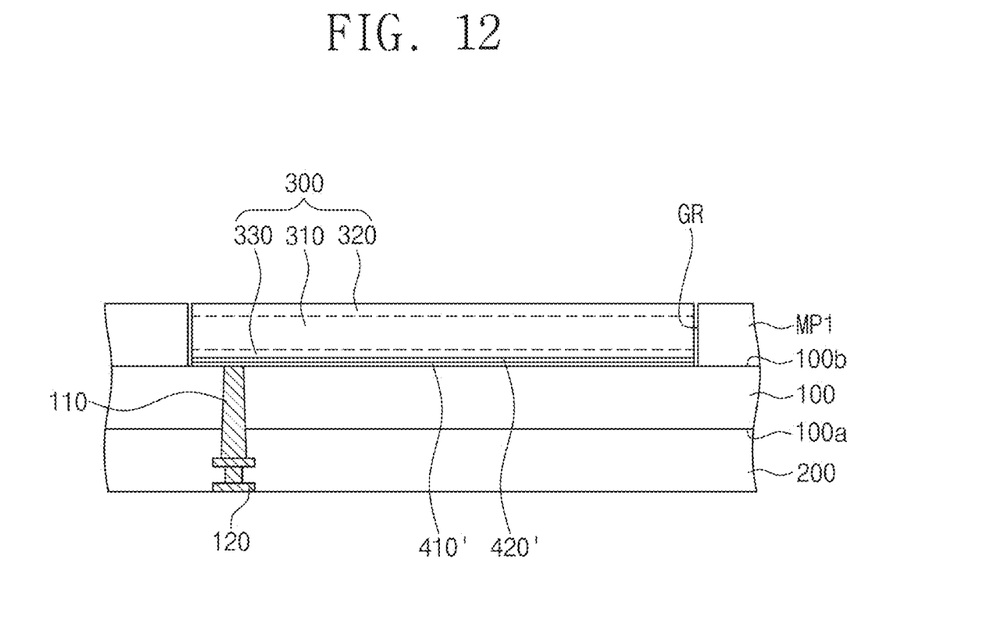

Referring to FIG. 12, a portion of the barrier layer 410 may be removed to form a barrier layer pattern 410'. For example, a portion of the barrier layer 410 exposed by the redistribution line 300 or on a side surface of the redistribution line 300 may be removed. A wet etching process may be used to remove the portion of the barrier layer 410. A remaining portion of the barrier layer 410 may remain in the groove GR as the barrier layer pattern 410'. In the groove GR, the barrier layer pattern 410' may be placed between the seed layer 420 and the second surface 100b of the semiconductor substrate 100. The redistribution line 300 may be formed through the aforementioned processes.

Figure 13:
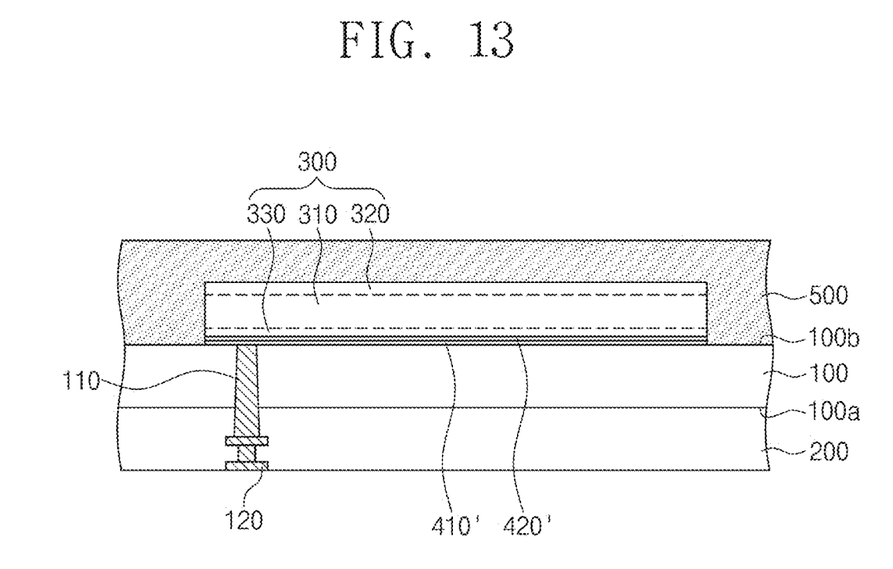

Referring to FIG. 13, the first mask pattern MP1 may be removed, and then a passivation layer 500 may be formed on the second surface 100b of the semiconductor substrate 100. The passivation layer 500 may be formed to cover the redistribution line 300 and the second surface 100b of the semiconductor substrate 100. The passivation layer 500 may include an inorganic dielectric layer (e.g., silicon oxide (SiOx) or silicon nitride (SiNx)) or an organic dielectric layer (e.g., polyimide (PI) or polybenzoxazole (PBO)). For example, the passivation layer 500 may be formed by coating polybenzoxazole (PBO) on the second surface 100b of the semiconductor substrate 100 and curing the polybenzoxazole (PBO). The passivation layer 500 may have a thickness of about 3 μm to about 5 μm.

Figure 14:
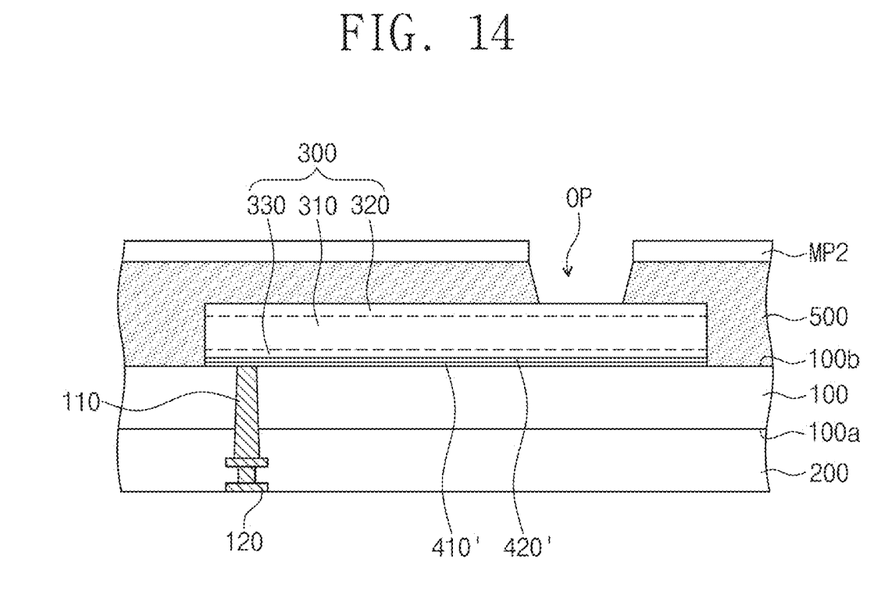
Figure 15:
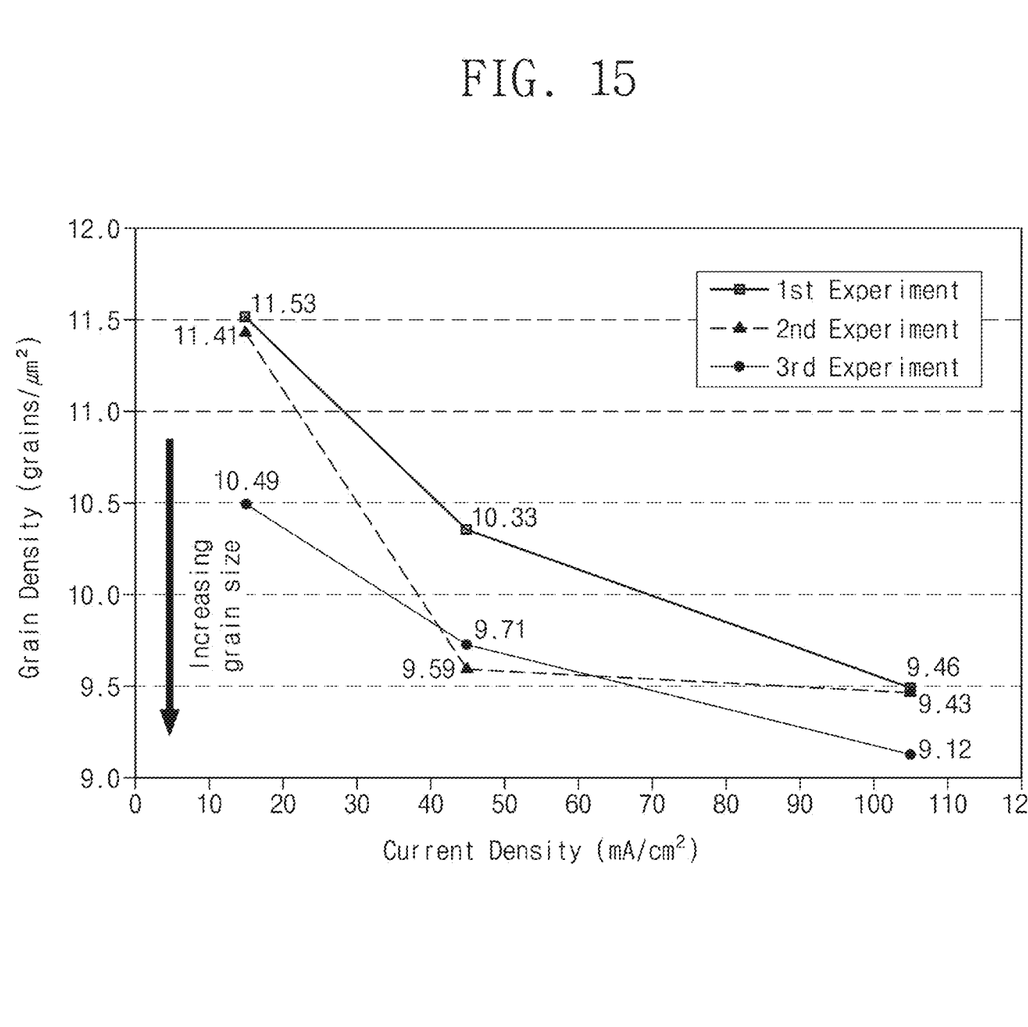
FIG. 15 illustrates a graph showing a relationship between current density and grain density while formed grains using a step plating process.

Referring to FIG. 14, the passivation layer 500 may be patterned to form an opening OP that partially exposes the redistribution line 300. For example, a second mask pattern MP2 may be formed on the passivation layer 500, and then an etching process may be performed in which the second mask pattern MP2 is used as an etching mask. The second mask pattern MP2 may include an organic material (e.g., photoresist) or an inorganic material (e.g., silicon oxide or silicon nitride).

Referring back to FIG. 1, the second mask pattern MP2 may be removed, and then a redistribution pad 600 may be formed in the opening OP. For example, a conductive material may be coated on the passivation layer 500, and then the conductive material may be patterned to form the redistribution pad 600. The redistribution pad 600 may be formed by various techniques. An external terminal 700 may be formed on the redistribution pad 600 to fabricate a semiconductor device.

In some example embodiments, after the redistribution pad 600 is formed, an oxide layer 510 may be formed between the redistribution line 300 and the passivation layer 500 due to heat generated in subsequent processes (e.g., deposition, plating, reflow and/or curing). For example, during the subsequent processes, heat associated with the subsequent processes may cause oxygen in the passivation layer 500 to react with materials (e.g., copper (Cu)) of the redistribution line 300. This reaction may automatically form a native metal oxide layer, or the oxide layer 510.

According to some example embodiments of the present inventive concepts, a semiconductor device may include the redistribution line that has an increased adhesion force with the passivation layer and/or the redistribution pad. Furthermore, because the top surface of the redistribution line has a relatively low surface roughness and a relatively high flatness, voids may be reduced between the redistribution line and the passivation layer or between the redistribution line and the metal conductive lines. Thus, the semiconductor device having improved structural stability may be achieved.

In addition, the redistribution line may be formed to have a relatively small average grain size at its surface portion. The redistribution line may be formed to have a relatively large average grain size at its other portion. For this purpose, a relatively high current density may be applied when a plating process for forming the other portion of the redistribution line is performed. Therefore, the first segment may be formed at a higher rate, and the redistribution line may be formed in a reduced time.

Although the present inventive concepts have been described in connection with the some example embodiments illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A method of manufacturing a semiconductor device, the method comprising:
   providing a semiconductor substrate;
   forming a redistribution line on a top surface of the semiconductor substrate; and
   forming a passivation layer to cover the redistribution line on the top surface of the semiconductor substrate,
   wherein the forming the redistribution line includes,
   a first stage of forming a first segment of the redistribution line on the top surface of the semiconductor substrate,
   a second stage of forming a second segment of the redistribution line on the first segment of the redistribution line, and
   a third stage of forming a third segment of the redistribution line on the top surface of the semiconductor substrate before performing the first stage, so that the performing the first stage forms the first segment on the third segment,
   wherein an average grain size of the second segment of the redistribution line is less than an average grain size of the first segment of the redistribution line.

2. The method of claim 1, wherein the first and second stages are successively performed.

3. The method of claim 2, wherein
   each of the first and second stages includes a plating process, and a voltage applied in the first stage is greater than a voltage applied in the second stage.

4. The method of claim 2, wherein
   each of the first and second stages includes a plating process, and
   a concentration of a plating solution used for the first stage is greater than a concentration of a plating solution used for the second stage.

5. The method of claim 2, wherein a plating solution is used for the second stage and includes a grain refiner.

6. The method of claim 2, wherein the first and second stages are performed in a same bath.

7. The method of claim 1, wherein a roughness of a bottom surface of the first segment is greater than a roughness of a top surface of the second segment.

8. The method of claim 1, wherein the average grain size of the second segment of the redistribution line is less than 70% of the average grain size of the first segment of the redistribution line.

9. The method of claim 1, wherein an average grain size of the third segment of the redistribution line is less than the average grain size of the first segment of the redistribution line.

10. The method of claim 1, further comprising:
etching the passivation layer to expose a portion of the redistribution line; and
forming a pad on the portion of the redistribution line that is exposed by the passivation layer.

11. The method of claim 1, further comprising:
forming a seed layer on the top surface of the semiconductor substrate before forming the redistribution line.

12. A semiconductor device, comprising:
a semiconductor substrate;
a redistribution line on a top surface of the semiconductor substrate, the redistribution line including a first segment on the top surface of the semiconductor substrate, a second segment on a top surface of the first segment, and a third segment between the first segment and the semiconductor substrate, an average grain size of the second segment of the redistribution line being less than an average grain size of the first segment of the redistribution line, an average grain size of the third segment is less than the average grain size of the second segment;
a passivation layer covering the redistribution line on the top surface of the semiconductor substrate; and
a pad on the passivation layer, the pad penetrating the passivation layer and in contact with the redistribution line.

13. The semiconductor device of claim 12, wherein a surface roughness of the first segment of the redistribution line is greater than a surface roughness of the second segment of the redistribution line.

14. The semiconductor device of claim 12, wherein the average grain size of the second segment of the redistribution line is less than 70% of the average grain size of the first segment of the redistribution line.

15. The semiconductor device of claim 12, wherein the second segment of the redistribution line is in contact with the top surface of the first segment and a bottom surface of the passivation layer.

16. The semiconductor device of claim 12, wherein the first and second segments include a same material.

17. The semiconductor device of claim 12, further comprising:
a seed layer between the redistribution line and the semiconductor substrate.

18. The semiconductor device of claim 12, further comprising:
a connection terminal on the pad.

* * * * *